United States Patent
Guyader et al.

(10) Patent No.: US 6,887,759 B2
(45) Date of Patent: May 3, 2005

(54) LDD-TYPE MINIATURIZED MOS TRANSISTORS

(75) Inventors: François Guyader, La Tronche (FR); Franck Arnaud, Le Sappey en Chartreuse (FR)

(73) Assignee: STMicroelectronics S.A., Montrouge (FR)

( * ) Notice: Subject to any disclaimer, the term of this patent is extended or adjusted under 35 U.S.C. 154(b) by 133 days.

(21) Appl. No.: 10/257,209

(22) PCT Filed: Oct. 5, 2001

(86) PCT No.: PCT/FR01/03076

§ 371 (c)(1),
(2), (4) Date: Jan. 23, 2003

(87) PCT Pub. No.: WO02/29881

PCT Pub. Date: Apr. 11, 2002

(65) Prior Publication Data

US 2004/0067612 A1 Apr. 8, 2004

(30) Foreign Application Priority Data

Oct. 6, 2000 (FR) .............................. 00 12806

(51) Int. Cl.$^7$ ................... H01L 21/336; H01L 21/3205; H01L 21/4763; H01L 21/44

(52) U.S. Cl. .................. 438/265; 438/595; 438/664
(58) Field of Search ................... 438/301, 265, 438/243, 595, 664, 724, 744; 257/383, 387, 385

(56) References Cited

U.S. PATENT DOCUMENTS

| | | | | |
|---|---|---|---|---|
| 5,397,909 A | * | 3/1995 | Moslehi ...................... 257/383 |
| 5,952,246 A | * | 9/1999 | Wang et al. ................. 438/724 |
| 6,521,529 B1 | * | 2/2003 | Ngo et al. ................... 438/664 |
| 6,740,574 B2 | * | 5/2004 | Gonzalez et al. ........... 438/595 |

\* cited by examiner

*Primary Examiner*—John F. Niebling
*Assistant Examiner*—Walter L. Lindsay, Jr.
(74) *Attorney, Agent, or Firm*—Lisa K. Jorgenson; Robert Iannucci; Seed IP Law Group PLLC

(57) ABSTRACT

The invention concerns a method for forming, in a substrate (1) having a first type of conductivity, a MOS transistor, comprising the following steps: a) forming on the substrate an insulated gate (3); b) implanting a doping agent having a second type of conductivity; c) forming on the edges of the gate silicon nitride spacers; d) simultaneously oxidising the apparent surfaces of the substrate, the gate and the spacers; and e) drain and source implantation.

17 Claims, 2 Drawing Sheets

LDD-TYPE MINIATURIZED MOS TRANSISTORS

The present invention generally relates to the manufacturing of MOS-type transistors having a gate length smaller than one micrometer. More specifically, the present invention relates to the forming of the source and drain regions in a semiconductor substrate.

FIGS. 1A to 1D illustrate in a simplified partial cross-section view a MOS transistor at different steps of a conventional manufacturing process.

Figure 1A:
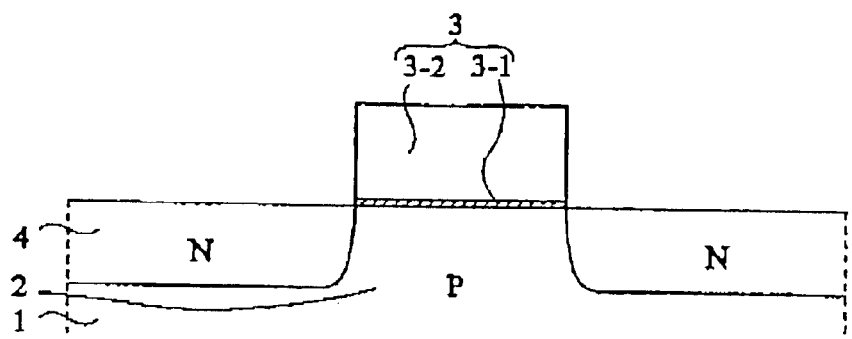

As illustrated in FIG. 1A, a channel region 2 is first defined, in a semiconductor substrate 1 of a first conductivity type, by an insulated gate 3. Gate 3 is obtained by the successive deposition and etching of a thin insulating layer 3-1 and of a layer 3-2 of a conductive material. The entire structure is then submitted to a low-power and low-dose implantation of dopants of the conductivity type opposite to that of substrate 1. Lightly-doped regions 4 are thus formed in substrate 1, on either side of channel 2 (LDD implantation).

It should be noted that such transistors having their channel 2 delimited by lightly doped regions (LDD) 4 are called "LDD-type transistors". The present description will further consider such "miniaturized" transistors, that is, transistors having a gate length smaller than one micrometer.

For simplification, it will be considered hereafter, as a non-limiting example, that substrate 1 is made of P-type single-crystal silicon. N-type dopants such as phosphorus or, preferably, arsenic, will then be implanted in regions 4. Gate insulator 3-1 generally is silicon oxide ($SiO_2$) and gate conductor 3-2 generally is polysilicon.

The LDD implantation will be followed by an anneal. This anneal is intended for enabling recrystallization of the surface of substrate 1. Indeed, upon impact of the doping atoms and upon their penetration, the crystal lattice of substrate 1 is deformed. This anneal is performed at a sufficiently low temperature and during a sufficiently short time to avoid causing the diffusion of the dopants. An anneal at a temperature ranging between 900 and 1050° C. is generally performed for 20 seconds.

Figure 1B:
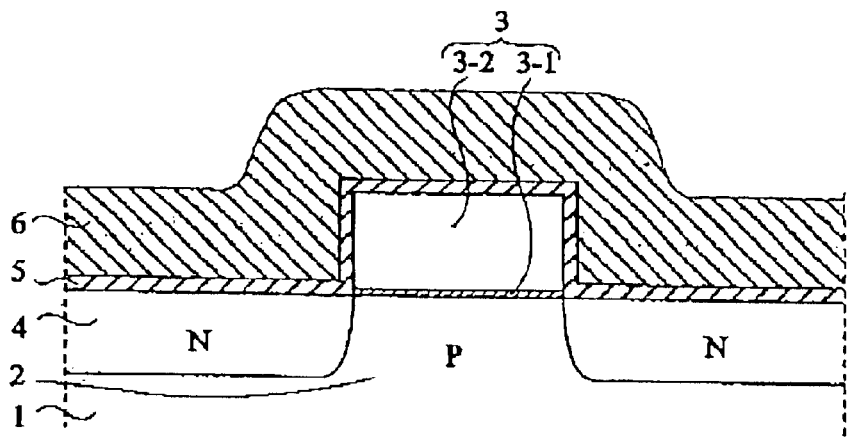

At the next steps, illustrated in FIG. 1B, a thin silicon oxide layer 5 and a silicon nitride layer ($Si_3N_4$) 6 are successively deposited over the entire structure.

Figure 1C:
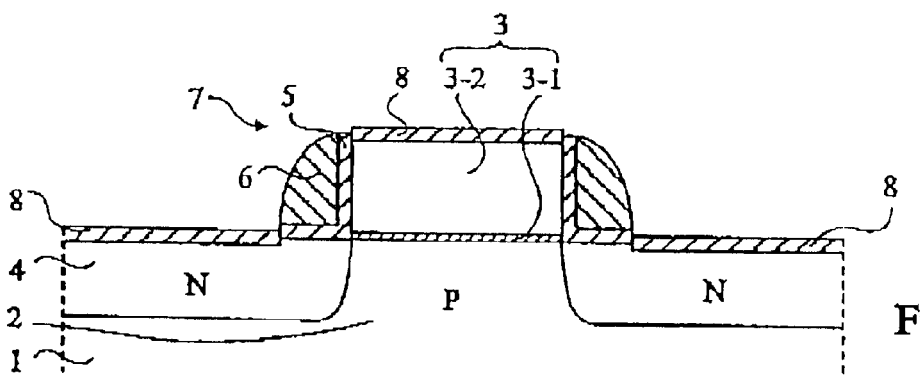

At the next steps, illustrated in FIG. 1C, layer 6 and 5 are successively etched to only leave portions thereof around gate 3. A composite lateral spacer 7 is thus formed around insulated gate 3.

Then, a sacrificial silicon oxide layer 8 of a thickness from 3 to 10 nm is grown. Layer 8 is formed on the exposed silicon surfaces, that is, on substrate 1, at the surface of regions 4, as well as at the surface of gate polysilicon 3-2.

Figure 1D:
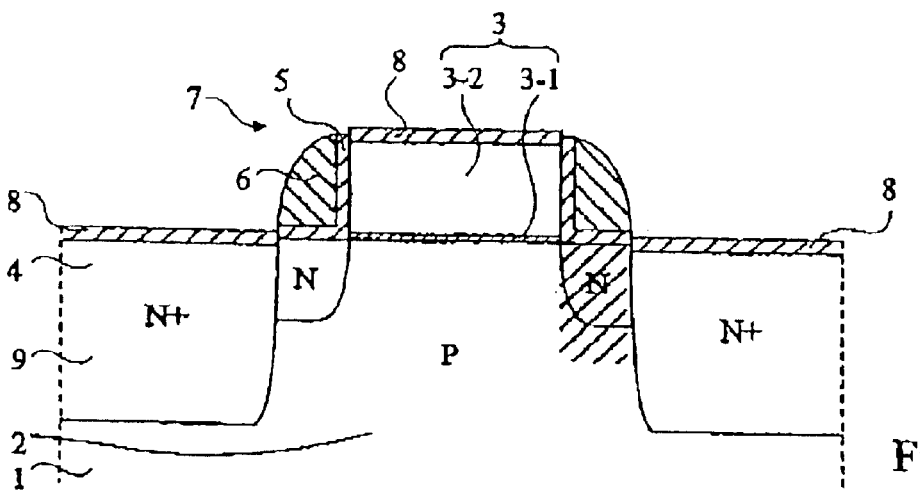

A dopant of the second conductivity type is then implanted at high power and high dose through layer 8. Heavily-doped source and drain regions 9, for example, of type $N^+$, are thus formed on either side of channel 2, as illustrated in FIG. 1D.

A new so-called activation anneal is then performed at a temperature on the order of 1000° C. for a relatively short time, for example approximately fifteen seconds. This anneal aims at activating the implanted dopants and recrystallizing the crystal structure deformed by the implantation of regions 9.

The disadvantages of this conventional method are the successive damages brought to the crystal structure in the vicinity of channel 2 defined by insulated gate 3.

Indeed, the first recrystallization anneal does not enable completely restoring the initial crystal structure. There remains, especially at the surface, and all along the dopant diffusion limit, a particularly embrittled area, or amorphization area. This area is all the larger and all the more damaged as the implanted ion is heavy. Thus, in the case of a P-channel transistor, the implantation being performed by means of boron atoms having a relatively low mass, such an anneal is sufficient to suppress most of the isolated defects that have been created. However, in the case of the implantation of heavy atoms, for example of arsenic upon formation of an N-channel MOS transistor, there remains after the anneal defects or faults in the crystal lattice.

Then, upon deposition of layer 6, given the relatively high stress imposed by silicon nitride, the underlying substrate 1 (channel 2 underlying gate 3 and LDD regions 4) is deformed under the effect of a mechanical stress.

After spacers 7 have been formed, the lattice keeps a certain deformation and a certain brittleness. This effect is particularly significant in regions underlying lateral spacer 7. Then, under the spacers a stressed area is present, and outside of the spacers defects occur.

In the subsequent implantation of source and drain regions 9, again, the lattice is deformed. The structural defects thus formed are all the greater and the more numerous as the implanted atoms are heavy and as the considered region is particularly sensitive, such as areas close to the lateral spacer. Dislocation loops are created.

The activation anneal is relatively efficient in the case of the implantation of relatively light atoms, as in the case of boron atoms upon forming, in an N-type substrate, of a P-channel MOS transistor. However, in the case of the implantation of relatively heavy atoms, such as arsenic atoms in the case of the formation of N-channel MOS transistors, this anneal appears to be insufficient.

The area disposed in the silicon under the external limit of the spacers corresponds to the limit between a stressed area and an area comprising defects and is accordingly highly perturbed. This causes malfunctions such as a modification of the switching thresholds of the transistors and the occurrence of leakage currents while the transistor is controlled to be off. Such malfunctions are all the greater as the transistor dimensions are reduced.

The present invention thus aims at providing a novel manufacturing method providing MOS transistors having a stabilized switching threshold and a reduced leakage current.

To achieve this object, the present invention provides a method for forming, in a substrate of a first conductivity type, a MOS transistor, including the steps of:

a) forming an insulating gate on the substrate;

b) implanting a dopant of the second conductivity type;

c) forming silicon nitride spacers on the gate edges;

d) simultaneously oxidizing the exposed surfaces of the substrate, of the gate, and of the spacers; and e) performing a drain and source implantation.

According to an embodiment, implantation step b) is followed by a recrystallization anneal.

According to an embodiment, step c) of forming of the silicon nitride spacers is preceded by the deposition of a silicon oxide layer.

According to an embodiment, step d) of simultaneous oxidation is performed in the presence of steam, which results in the forming of a silicon oxide layer having a thickness ranging between 3 and 10 nm on the substrate and on the silicon nitride spacers.

The present invention also provides a MOS transistor including, in a substrate of a first conductivity type, a channel defined by an insulated gate provided with lateral silicon nitride spacers formed on the substrate, first lightly-doped regions of the second conductivity type separating the channel from second heavily-doped regions of the second conductivity type, the first and second regions being formed on either side of the gate, the limit between the first and second regions being beyond the region underlying the spacers.

Figure 2A:
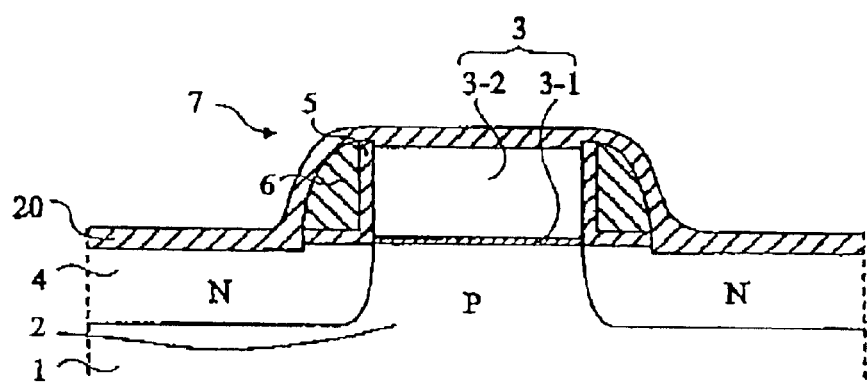
Figure 2B:
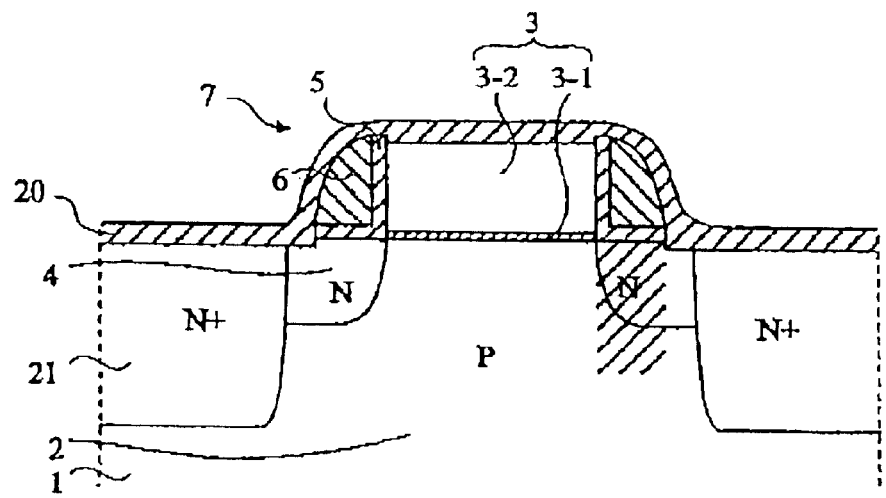

The foregoing and other objects, features and advantages of the present invention, will be discussed in detail in the following non-limiting description of specific embodiments in connection with the accompanying drawings, in which:

FIGS. 1A to 1D illustrate, in a partial simplified cross-section view, a conventional method of MOS transistor manufacturing; and FIGS. 2A and 2B illustrate, in a partial simplified cross-section view, successive steps of manufacturing of a MOS transistor according to the present invention.

For clarity, the same elements have been designated with the same references in the different drawings and, further, as usual in the representation of integrated circuits, the various drawings are not to scale.

The present invention is based on an analysis of the origin of malfunctions in a conventional transistor. The inventors have come to the conclusion that the various conventional attempts of restoring the crystal structure of the substrate have relatively limited effects. Such attempts, for example recrystallization anneals or modifications of the conditions (power and/or dose) of the various implantations, are inoperative in the case of LDD-type miniaturized transistors. According to the inventors, the malfunctions then come from the forming of the limit between a drain/source region 9 and an LDD region 4 in a particularly damaged region, hatched in FIG. 1D, close to channel 2.

A method of MOS transistor forming according to the present invention is discussed hereafter, as a non-limiting example, in relation with FIGS. 2A and 2B, in the specific case of the forming of an N-channel MOS transistor in a P-type semiconductor substrate 1.

The method according to the present invention starts with steps similar to those previously described in relation with FIGS. 1A to 1C:
- definition of a channel 2 in substrate 1, by the forming of a gate 3 formed of a gate insulator 3-1, for example, a silicon oxide layer having a thickness of approximately 2 nm, and of a gate conductor 3-2, for example a polysilicon layer having a thickness of approximately 20 nm;
- forming of LDD regions 4, for example of type N, preferably by low energy and low dose implantation of arsenic; and
- forming of silicon nitride spacers 7, by deposition and etching of a silicon nitride layer 6 having a thickness of approximately 50 nm. Preferably, the forming of silicon nitride spacers 7 is preceded by the deposition of a first insulating layer 5, for example made of silicon oxide, relatively thin, having a thickness of approximately 20 nm.

At this manufacturing step, as illustrated in FIG. 2A, all exposed surfaces are oxidized according to the present invention. In other words, a silicon oxide 20 is formed on all silicon surfaces of substrate 1 (LDD regions 4) and of gate 3 as well as on silicon nitride portions 6 of spacers 7. The forming conditions of layer 20 resulting from a simultaneous oxidation of the silicon and of the silicon nitride will be discussed subsequently.

At the next step, illustrated in FIG. 2B, heavily-doped drain and source regions 21, for example of type N$^+$, are formed by a high-energy and high-dose implantation, for example of arsenic. Regions 21 are more distant from the area underlying silicon nitride portion 6 than the homologous regions of the conventional transistor of FIG. 1D.

The structure illustrated in FIG. 2B may be completed by the various conventional steps of semiconductor component forming (contacting areas, forming of connections, . . . ).

It should be noted that upon formation of the transistors according to the present invention, recrystallization anneals may also be provided after each implantation step. The anneals will be performed in conventional conditions, for example, such as discussed in relation with FIGS. 1A and 1D.

An advantage of the present invention is to move the limit of source and drain regions 21 away from the heavily-stressed regions located under the silicon nitride and hatched in FIGS. 1D and 2B. Additionally, the reoxydation of the nitride moves away the limit of the stressed region while the limit of the defect-comprising region does not move. So a silicon region of particularly good quality is obtained in the limit region between the low doped drain and source portions and the high doped drain and source regions. It will be understood that this result (creation of a region without defects) would not have been doped by depositing an oxide layer on the nitride. The present invention thus enables manufacturing transistors exhibiting more regular and more stable switching thresholds and having a smaller leakage current.

Another advantage of the present invention is that it enables reduction of the ratio of devices (MOS transistors) having malfunctions. Indeed, upon etching of silicon nitride layer 6 to form spacers (as discussed previously in relation with FIGS. 1B and 1C), it is frequent for silicon nitride residue, generally isolated, to remain in place. With conventional methods, such a residue generally remains in place during the rest of the manufacturing process. Its presence may affect the transistor operation. Due to the oxidation according to the present invention of silicon nitride, such a residue is oxidized or completely encapsulated in sacrificial insulating layer 20. Accordingly, in the subsequent step (not shown) of removal of sacrificial implantation oxide 20, it is removed. This further contributes to stabilizing the operation of MOS transistors obtained according to the method of the present invention.

As an example, the step of simultaneous oxidation according to the present invention is performed by using an ultra-thin silicon oxide layer growth method, such as an in-situ steam generated—ISSG—oxidation or a remote plasma oxidation. It will be seen to it to use a method such that the silicon nitride oxidation occurs substantially at the same speed as that of silicon. It is however possible to use slightly selective oxidation methods, provided that the obtained layer 20 fulfils the following thickness criteria.

The thickness of layer 20 is chosen according to a compromise between various conditions. On the one hand, the total thickness of layer 20 above substrate 1 must be sufficiently low to enable penetration of the dopants to an appropriate depth into substrate 1 without having to modify the implantation energies or doses. On the other hand, the portion of layer 20 exceeding the initial thickness (before oxidation) of spacer 7 must be sufficiently large to cause a sufficient distance of regions 21 from initial spacer 7.

For example, by using a method of ISSG type, a layer 20 having a thickness ranging between 8 and 10 nm can be obtained. This thickness is obtained by a same consumption on the order of 3 nm of the thickness of the silicon portions (substrate 1, gate 3) and of the silicon nitride portions, and a growth of an additional silicon oxide layer over a thickness on the order of from 5 to 7 nm. The transistors thus obtained have a leakage current density ranging between 1 and $10.10^{-12}$ A/$\mu$m$^2$, while conventional transistors exhibit such a density on the order of $100.10^{-12}$ A/$\mu$m$^2$.

Another advantage of the invention is that it provides miniaturized transistors, in particular due to the fact that the reoxidation of a nitride layer can be made with a good control of the oxide thickness.

Of course, the present invention is likely to have various alterations, modifications, and improvements which will readily occur to those skilled in the art. In particular, the present invention applies to all type of monolayer or composite spacers essentially formed of silicon nitride.

Further, the principles according to the present invention have been discussed hereabove in relation with the specific case of the forming of an N-channel MOS transistor in a P-type substrate. Those skilled in the art should understand that a P-type MOS transistor could be formed according to the same principles in an N-type substrate. Further, although the present invention has been previously described in the context of the forming of a single type of transistor, it also applies to complementary methods.

What is claimed is:

1. A method for forming, in a substrate of a first conductivity type, a MOS transistor, comprising the steps of:
    a) forming an insulated gate on the substrate;
    b) implanting a dopant of a second conductivity type;
    c) forming silicon nitride spacers on edges of the gate;
    d) simultaneously oxidizing exposed surfaces of the substrate, of the gate, and of the spacers; and
    e) performing a drain and source implantation.

2. The method of claim 1, wherein the implanting step b) is followed by a recrystallization anneal.

3. The method of claim 1, wherein step c) of forming of the silicon nitride spacers is preceded by the deposition of a silicon oxide layer.

4. The method of claim 1, wherein step d) of simultaneous oxidation is performed in the presence of steam, which results in the forming of a silicon oxide layer having a thickness ranging between 3 and 10 nm on the substrate and on the silicon nitride spacers.

5. A MOS transistor comprising, in a substrate of a first conductivity type, a channel defined by an insulated gate provided with lateral silicon nitride spacers formed on the substrate, lightly-doped first regions of a second conductivity type separating the channel from heavily-doped second regions of the second conductivity type, the first and second regions being formed on either side of the gate, the first and second regions sharing a boundary that is spaced laterally from the spacers.

6. A method for forming a MOS transistor, comprising:
    forming an insulated gate on a channel region of a substrate of a first conductivity type;
    forming a first lightly-doped region of a second conductivity type in the substrate and adjacent to the channel region;
    forming a first spacer on the substrate, above the first lightly-doped region and immediately adjacent to a first side of the gate;
    forming an insulating layer that covers the gate, the first spacer, and a first portion of the substrate laterally adjacent to the first spacer; and
    forming a first heavily-doped region in the substrate by implanting dopants through a first portion of the insulating layer that covers the first portion of the substrate.

7. The method of claim 6, further comprising performing a recrystallization anneal of the substrate after forming the first lightly-doped region.

8. The method of claim 5, wherein forming the first spacer includes forming an oxide layer on the gate and the substrate, forming a nitride layer on the oxide layer, and etching the nitride and oxide layers, thereby removing the nitride and oxide layers from a top of the gate and the substrate except for the first spacer laterally adjacent to the gate.

9. The method of claim 6, wherein forming the insulating layer includes simultaneously oxidizing the gate, first spacer, and substrate in the presence of steam.

10. The method of claim 6, wherein forming the insulating layer includes forming a silicon oxide layer having a thickness ranging between 3 and 10 nm on the substrate and on the first spacer.

11. The method of claim 6, wherein the first spacer includes silicon nitride and the step of forming the insulating layer includes oxidizing the silicon nitride and the substrate to a thickness within a range of 3 and 10 nm.

12. The method of claim 6, further comprising:
    forming a second lightly-doped region of a second conductivity type in the substrate and on an opposite side of the channel region from the first lightly-doped region;
    forming a second spacer on the substrate, above the second lightly-doped region and immediately adjacent to a second side of the gate, wherein the insulating layer also covers the second spacer and a second portion of the substrate laterally adjacent to the second spacer; and
    forming a second heavily-doped region in the substrate by implanting dopants through a second portion by the insulating layer that covers the second portion of the substrate.

13. A MOS transistor, comprising:
    a substrate of a first conductivity type;
    an insulated gate formed on the substrate and defining a channel in the substrate below the gate;
    a first spacer formed on the substrate and immediately adjacent to a first side of the gate;
    a first lightly-doped region of a second conductivity type formed in the substrate adjacent to the channel; and
    a first heavily-doped region of the second conductivity type formed in the substrate and separated from the channel by the first lightly-doped region, the first lightly-doped and heavily-doped regions sharing a boundary that is spaced laterally from the first spacer.

14. The MOS transistor of claim 13, wherein the first spacer includes an oxide layer immediately adjacent to the gate and on the substrate, and a nitride layer on the oxide layer.

15. The MOS transistor of claim 13, wherein the insulating layer includes a silicon oxide layer having a thickness ranging between 3 and 10 nm on the substrate and on the first spacer.

16. The MOS transistor of claim 13, wherein the first spacer includes silicon nitride and the insulating layer includes oxidized silicon nitride within a range of 3 and 10 nm.

17. The MOS transistor of claim 13, further comprising:
    a second lightly-doped region of a second conductivity type in the substrate and on an opposite side of the channel from the first lightly-doped region;
    a second spacer on the substrate, above the second lightly-doped region and immediately adjacent to a second side of the gate, wherein the insulating layer also covers the second spacer and a second portion of the substrate laterally adjacent to the second spacer; and
    a second heavily-doped region of the second conductivity type formed in the substrate and separated from the channel by the second lightly-doped region, the second lightly-doped and heavily-doped regions sharing a boundary that is spaced laterally from the second spacer.

* * * * *

UNITED STATES PATENT AND TRADEMARK OFFICE
CERTIFICATE OF CORRECTION

PATENT NO.   : 6,887,759 B2
DATED        : May 3, 2002
INVENTOR(S)  : Francois Guyader et al.

It is certified that error appears in the above-identified patent and that said Letters Patent is hereby corrected as shown below:

Column 6,
Lines 24 and 25, "by the insulating layer" should read as -- of the insulating layer --.

Signed and Sealed this

Fourth Day of October, 2005

JON W. DUDAS
*Director of the United States Patent and Trademark Office*